United States Patent
Chen et al.

(10) Patent No.: US 11,004,612 B2
(45) Date of Patent: May 11, 2021

(54) LOW TEMPERATURE SUB-NANOMETER PERIODIC STACK DIELECTRICS

(71) Applicant: MicroSol Technologies Inc., Dallas, TX (US)

(72) Inventors: Yuanning Chen, Plano, TX (US); Jesus Israel Mejia Silva, Frisco, TX (US); Chunya Wu, Plano, TX (US); Deborah Jean Riley, Murphy, TX (US); Yun-Ju Lee, Fairborn, OH (US)

(73) Assignee: MicroSol Technologies Inc., Dallas, TX (US)

( * ) Notice: Subject to any disclaimer, the term of this patent is extended or adjusted under 35 U.S.C. 154(b) by 99 days.

(21) Appl. No.: 16/354,134

(22) Filed: Mar. 14, 2019

(65) Prior Publication Data

US 2020/0294722 A1    Sep. 17, 2020

(51) Int. Cl.
*B32B 17/06*    (2006.01)
*B32B 15/04*    (2006.01)
*H01G 4/30*    (2006.01)
*H01L 49/02*    (2006.01)
*H01G 4/08*    (2006.01)
*H01G 4/33*    (2006.01)

(52) U.S. Cl.
CPC ............ *H01G 4/306* (2013.01); *H01G 4/085* (2013.01); *H01G 4/33* (2013.01); *H01L 28/60* (2013.01)

(58) Field of Classification Search
CPC ........ H01G 4/306; H01G 28/60; H01G 4/085; H01G 4/33; H01G 4/252
USPC ................................................. 428/701, 702
See application file for complete search history.

(56) References Cited

U.S. PATENT DOCUMENTS

| | | | | |
|---|---|---|---|---|
| 6,362,091 B1 * | 3/2002 | Andideh | ........... | H01L 21/76801 257/E21.576 |
| 6,645,608 B2 * | 11/2003 | Schulz | ................ | C03C 17/3411 428/212 |
| 7,078,814 B2 * | 7/2006 | Stamper | ............ | H01L 21/31116 257/760 |

(Continued)

*Primary Examiner* — Lauren R Colgan
(74) *Attorney, Agent, or Firm* — Foley & Lardner LLP (57) ABSTRACT

MIM capacitors using low temperature sub-nanometer periodic stack dielectrics (SN-PSD) containing repeating units of alternating high dielectric constant materials sublayer and low leakage dielectric sublayer are provided. Every sublayer has thickness less than 1 nm (sub nanometer). The high dielectric constant materials could be one or more different materials. The low leakage dielectric materials could be one or more different materials. For the SN-PSD containing more than two different materials, those materials are deposited in sequence with the leakage current of the materials from the lowest to the highest and then back to the second-lowest, or with the energy band gap of the materials from the widest to the narrowest and then back to the second widest in each periodic cell. A layer of low leakage current dielectric materials is deposited on and/or under SN-PSD. The dielectric constant of SN-PSD is much larger than that of the component oxides and can be readily deposited at 250° C. using atomic layer deposition (ALD). The ALD deposition cycle could be 20-1000 cycles. The deposition technology is not limited to ALD, could be thermal oxidation, chemical vapor deposition (CVD), plasma enhanced chemical vapor deposition (PECVD) and other thermal source assisted deposition.

8 Claims, 6 Drawing Sheets

(56) References Cited

U.S. PATENT DOCUMENTS

| | | | | |
|---|---|---|---|---|
| 7,172,960 | B2* | 2/2007 | Natarajan | H01L 21/0276 257/E21.017 |
| 10,730,790 | B2* | 8/2020 | Paulson | H05K 5/0017 |
| 2005/0244623 | A1* | 11/2005 | Nishida | G02B 1/116 428/212 |
| 2008/0121962 | A1* | 5/2008 | Forbes | H01L 21/02178 257/310 |
| 2008/0182427 | A1* | 7/2008 | Oberbeck | H01L 21/31641 438/785 |
| 2013/0128342 | A1* | 5/2013 | Mitarai | B32B 17/10 359/359 |
| 2013/0176615 | A1* | 7/2013 | Uefuji | G02B 1/113 359/359 |
| 2013/0264680 | A1* | 10/2013 | Auciello | H01L 28/40 257/532 |
| 2014/0017601 | A1* | 1/2014 | Mikami | G03F 1/24 430/5 |
| 2014/0362444 | A1* | 12/2014 | Paulson | G02B 1/105 359/586 |
| 2014/0376094 | A1* | 12/2014 | Bellman | G02B 1/113 359/580 |
| 2015/0293284 | A1* | 10/2015 | Tatemura | G02B 5/283 359/359 |
| 2015/0325587 | A1* | 11/2015 | Chen | H01L 27/11582 257/314 |
| 2017/0263619 | A1* | 9/2017 | Nagashima | H01L 29/0649 |
| 2019/0223268 | A1* | 7/2019 | Seppanen | C23C 16/403 |
| 2019/0237616 | A1* | 8/2019 | Anderson | H01L 33/06 |
| 2020/0312794 | A1* | 10/2020 | West | H01L 23/645 |

* cited by examiner

LOW TEMPERATURE SUB-NANOMETER PERIODIC STACK DIELECTRICS

TECHNICAL FIELD

The present invention relates generally to materials. Specifically, the present invention is related to low temperature sub-nanometer periodic stack dielectrics (SN-PSD) with high capacitance density, low leakage current, and the high break down voltage, and related processes.

BACKGROUND

Frequent challenges arise with respect to the dielectric materials. For instance, various material properties are desirable, but may not all be present in a particular dielectric material. Thus, there is a need for low temperature sub-nanometer periodic stack dielectrics with high capacitance density, low leakage current, and the high break down voltage.

SUMMARY

The present application discloses fabrication of MIM capacitors using SN-PSD layers composed of $TiO_2$ and $HfO_2$ and other materials deposited by ALD or other deposition methods. Herein is provided a characterization of the reliability and demonstration of the superior performance of the SN-PSD films, for example, as compared to single layered dielectrics under similar capacitance density. The voltage driving breakdown and time dependent dielectric breakdown (TDDB) tests are used to characterize the reliability of SN-PSD MIM devices.

Further disclosed is the use of self-assembled monolayers as capping layers, significantly improving the performance of $HfO_2/TiO_2$ SN-PSD metal-insulator-metal capacitors. In particular, by examining the effect of controlling the chain length of alkylphosphonic acid molecules, an octadecylphosphonic acid self-assembled monolayer may be provided with both desirable suppression of leakage current and minimization of capping layer thickness. In various embodiments, a 60% improvement in capacitance density compared to $HfO_2$ capping layer may arise. Other materials of Barium-Strontium Titanate (BST), $ZnO_2$, and other high dielectric materials are potential of SN-PSD.

DESCRIPTION OF THE FIGURES (BRIEF DESCRIPTION)

Reference is now made to the following descriptions taken in conjunction with the accompanying drawings, in which.

DETAILED DESCRIPTION

This disclosure involves high dielectric constant (high-k) capacitors. More particularly, the present application relates to semiconductor processes that optimize high-k capacitor performance.

High dielectric constant materials (high-k) have attracted ongoing research interest for their applications in transistors and memories. To minimize leakage current effect, a thicker capping layer is commonly used in series with the high-k material to reduce quantum mechanical tunneling and enhance the device reliability. If high-k is intended for novel devices on glass and flexible plastics substrate, low temperature fabrication process is implementable in order to be compatible with the substrates. In various instances, 150 nm thick sub-nanometric periodic stacked dielectric (SN-PSD), containing alternating $Al_2O_3$ and $TiO_2$ sublayers, can exhibit theoretical relative dielectric constant of up to 1,000 when the sublayer thickness was less than 0.5 nm. Since the relative dielectric constant of the SN-PSDs is much greater than that of the component oxides and can be readily deposited at 250° C. using atomic layer deposition (ALD), it offers a promising route toward fabrication of high performance metal-insulator-metal (MIM) capacitors. However, even when the expected dielectric constant of standalone SN-PSD can be great, these films may often be deposited on top of another dielectric material (relatively low-k such as $SiO_2$) to limit the leakage current, which may reduce the overall capacitance in the MIM structure and may make them less practical to be implemented in conventional technologies.

The performance of MIM capacitors containing SN-PSD dielectrics is described using parameters such as capacitance density ($C_{den}$), leakage current density (J) and reliability. Leakage current is caused in part by the SN-PSD architecture consisting of an interpenetrating network of low and high resistance domains, and as the domain thickness of a dielectric decreases, quantum tunneling of electrons and hence leakage current becomes increasingly problematic. Past solutions resolved the leakage current issue by depositing a thick (~5 nm) capping layer of $Al_2O_3$ on top of the SN-PSD. However, the low relative dielectric constant value of $Al_2O_3$ (~9 nm) in series with the SN-PSD limits the maximum $C_{den}$ of the overall stack to ~16 $fF/\mu m^2$.

Thus, there may be a desire to improve the performance of SN-PSD MIM capacitors by increasing capacitance density $C_{den}$ and reliability while decreasing leakage current J.

The dielectric behavior of MIM capacitors made by SN-PSD with a capping layer can be qualitatively understood as a SN-PSD capacitor connected with a topping layer capacitor in series. $HfO_2$ has a dielectric constant of 25-30, while $Al_2O_3$ has a relatively low dielectric constant of 9-12, therefore, we employed $HfO_2$ to replace $Al_2O_3$ in order to further improve the dielectric performance of SN-PSD devices.

In addition to the dielectric characteristics offered by these materials, reliability is a critical factor for applications in electronic devices. Hf is in the same element group as Ti, which may reduce the interface defects of $HfO_2/TiO_2$ due to the similar electronic structure and crystal configuration of their component oxide, and then improve the stability of SN-PSD material. Moreover, $HfO_2$ has a better reliability than that of $Al_2O_3$. So the introduction of $HfO_2$ may not only enhance the performance but also the reliability of SN-PSD devices.

Figure 1A:
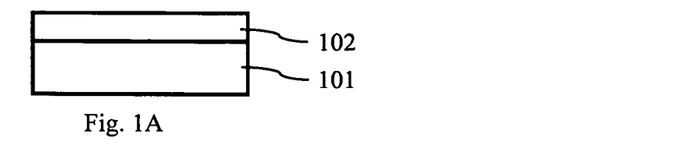
FIG. 1A depicts a schematic cross-sectional view of a semiconductor structure according to an embodiment of the process of the invention, after a $SiO_2$ layer is deposited on top of a Si substrate, in accordance with various embodiments.
Figure 1B:
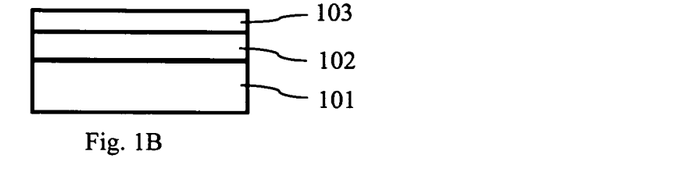
FIG. 1B depicts a schematic cross-sectional view of a semiconductor structure after a Ti/Pt 30/150 nm bottom contact is deposited using electron-beam evaporation, in accordance with various embodiments.
Figure 1C:
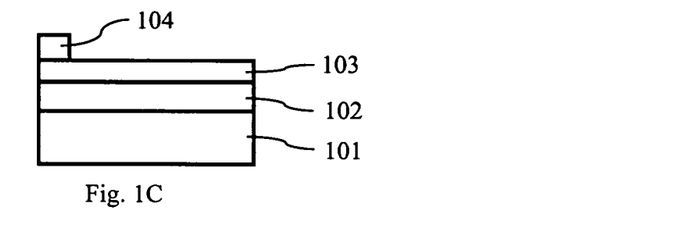
FIG. 1C depicts a schematic cross-sectional view of a semiconductor structure with a mask to protect the bottom electrode before an SN-PSD deposition, in accordance with various embodiments.
Figure 1D:
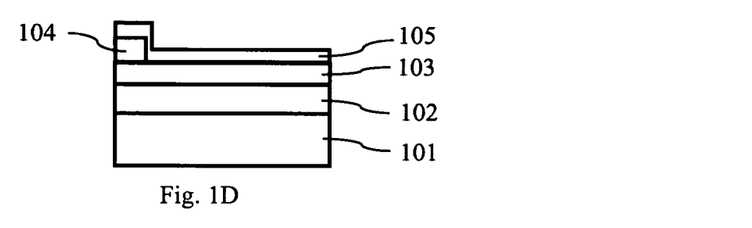
FIG. 1D depicts a schematic cross-sectional view of a semiconductor structure after a bottom low leakage current layer, a SN-PSD deposition by ALD, and/or a top low leakage current layer in accordance with various embodiments.
Figure 1E:
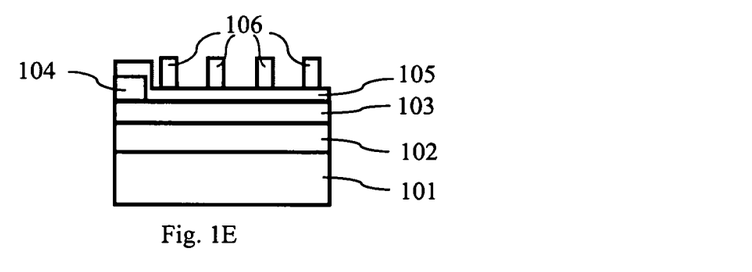
FIG. 1E depicts a schematic cross-sectional view of a semiconductor structure after a shadow mask is applied to define a top electrode area, in accordance with various embodiments.
Figure 1F:
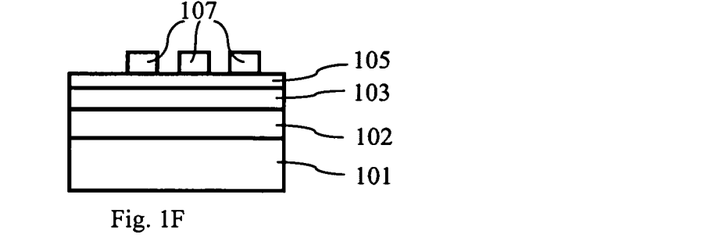
FIG. 1F depicts a schematic cross-sectional view of a semiconductor structure after a Pt top electrode is deposited using electron beam evaporation, the shadow mask is stripped and the mask to protect the bottom metal electrode removed, in accordance with various embodiments.

MIM capacitors with two different types of SN-PSD consisting of alternating subnanometer layers of $Al_2O_3/TiO_2$ and $HfO_2/TiO_2$ were fabricated. FIG. 1A, FIG. 1B, FIG. 1C, FIG. 1D, FIG. 1E and FIG. 1F illustrate the MIM capacitors fabrication process consisting in FIG. 1A of 300 nm of thermally growth $SiO_2$ 102 on top of a Si substrate 101. FIG. 1B shows 30 nm of Ti on top of 150 nm of Pt which were evaporated by e-beam (Temescal 1800) to form a common bottom electrode 103. The substrate was then clipped into multiple pieces of 20×30 mm² area, then in FIG. 1C a mask 104 was used to protect the bottom contact area prior to SN-PSD 105 deposition by ALD (Cambridge NanoTech Savannah 100 ALD). FIG. 1D shows the SN-PSD 105 was deposited implementing several dielectric layers configurations and thickness. $Al_2O_3/TiO_2$ and $HfO_2/TiO_2$ were the two different SN-PSD stack material configurations, for 0.7-0.3, 0.5-0.5 and 0.3-0.7 nm were used keeping a total thickness of 1.0 nm SN-PSC layer. The final devices were in various instances made up of 50, 75, 100 and 150 layers using 0, 1, 2, 3, 4 and 5 nm of $Al_2O_3$ or $HfO_2$ as capping layer to reduce the leakage current for $TiO_2/Al_2O_3$ and $TiO_2/HfO_2$, respectively. FIG. 1E shows a shadow mask 106 was attached to the SN-PSD surface in order to define the top electrodes using Pt (200 nm) deposited by e-beam. The top electrode 107 diameters were 100, 200, 300 and 500 µm. (F) Then, the masks for the top 106 and bottom 104 electrodes were removed for testing.

Since the dielectric constant of SN-PSD is much large than that of the component oxides and can be readily deposited at 250° C. using atomic layer deposition (ALD), the ALD deposition cycle in various instances should be 20-1000 cycles. The deposition technology is not limited to ALD, and includes thermal oxidation, chemical vapor deposition (CVD), plasma enhanced chemical vapor deposition (PECVD) and other thermal source assisted depositions.

The electrical characterization of the MIM capacitors was measured at room temperature using a Keithley 4200 Semiconductor Characterization System and Agilent 4284A Precision LCR Meter.

The SN-PSD is not limited to contain two different materials in a periodic cell. It may contain more than two different materials. Those materials are deposited in sequence with the leakage current of the materials from the lowest to the highest and then back to the second-lowest, or with the energy band of the materials from the widest to the narrowest and then back to the second widest in each periodic cell. But the stack structure in a periodic cell is not limited to these sequences, as long as it can reduce the leakage current of SN-PSD.

Figure 2A:
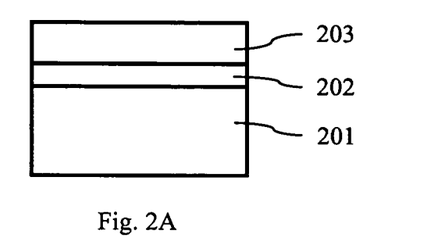
FIG. 2A depicts a schematic cross-sectional view of the SN-PSD dielectric materials with a bottom leakage current cap layer on a substrate in accordance with various embodiments.

FIG. 2A shows a schematic cross-sectional view of the dielectric materials with a bottom leakage current cap layer in a SN-PSD based capacitor in accordance with various embodiments. Wherein 201 is a substrate with a layer of buffer material and a layer of bottom electrode, 202 is a bottom cap layer to reduce the leakage current of SN-PSD MIM capacitors and 203 is SN-PSD dielectric.

Figure 2B:
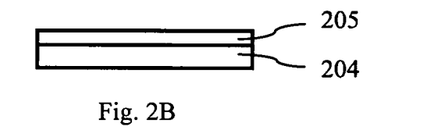
FIG. 2B depicts a schematic cross-sectional view of a stack structure in a periodic cell of the SN-PSD containing two different materials.

FIG. 2B shows a schematic cross-sectional view of a stack structure in a periodic cell of the SN-PSD dielectrics containing two different materials. Wherein, 204 is a low leakage current material or a wide energy band gap material and 205 is a high dielectric constant material or a narrow band gap material.

Figure 2C:
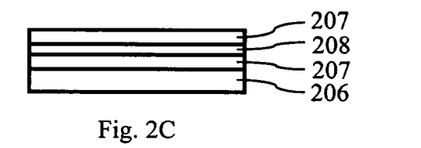
FIG. 2C depicts a schematic cross-sectional view of a stack structure in a periodic cell of the SN-PSD containing three different materials.

FIG. 2C shows a schematic cross-sectional view of a stack structure in a periodic cell of the SN-PSD containing three different materials. Wherein, 206 is the lowest leakage current material or the widest energy band gap material, 207 is the second lowest leakage current material or the second narrowest band gap material and 208 is the third lowest leakage current material or the third narrowest band gap material.

Figure 2D:
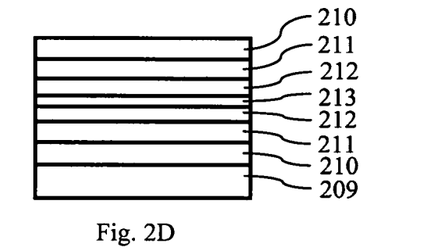
FIG. 2D depicts a schematic cross-sectional view of a stack structure in a periodic cell of the SN-PSD containing five different materials.

FIG. 2D shows a schematic cross-sectional view of a stack structure in a periodic cell of the SN-PSD containing three different materials. Wherein, 209 is the lowest leakage current material or the widest energy band gap material, 210 is the second lowest leakage current material or the second narrowest band gap material, 211 is the third lowest leakage current material or the third narrowest band gap material, 212 is the forth lowest leakage current material or the forth narrowest band gap material, 313 is the fifth lowest leakage current material or the fifth narrowest band gap material.

Figure 3:
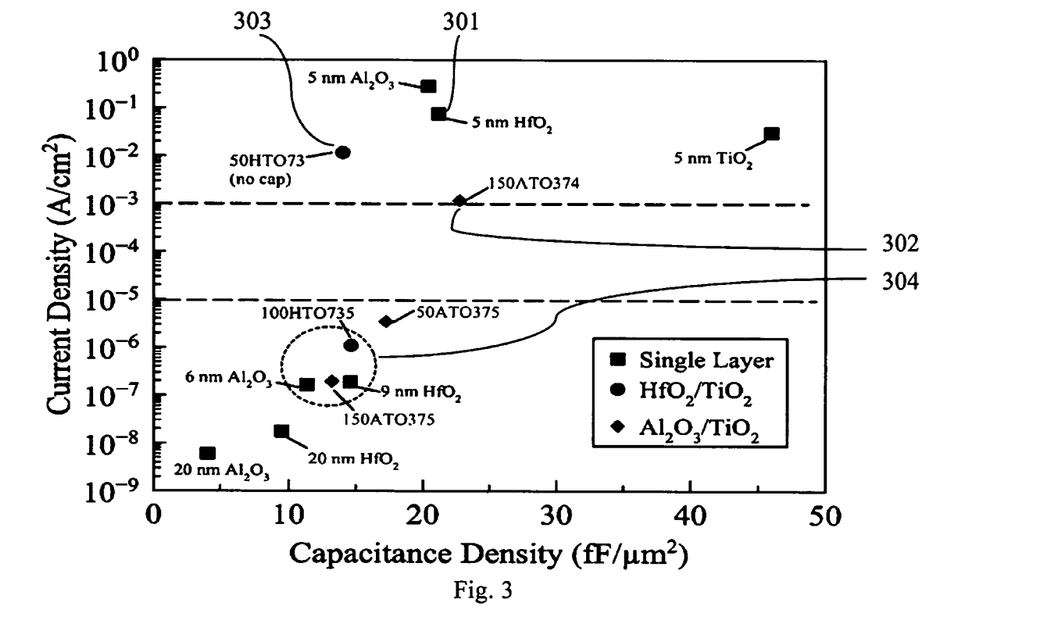
FIG. 3 depicts a comparison of the various capacitor structures in terms of capacitance density and leakage current for SN-PSD capacitors using $TiO_2$, $Al_2O_3$, and $HfO_2$, in accordance with various embodiments.

FIG. 3 illustrates the capacitance density vs. leakage current density at 1 V bias voltage for SN-PSD with different thickness ratio of $Al_2O_3/TiO_2$ and $HfO_2/TiO_2$, different cycle number of the sublayer (i.e. the total thickness of SN-PSD) and different thickness of capping layer we fabricated. As can be seen, we can differentiate at least three groups with specific capacitance and leakage current characteristics. Single layer capacitors 301 refer to structures consisting in dielectrics made out of single materials such as $HfO_2$, $Al_2O_3$ and $TiO_2$ (squares 301). At 5 nm dielectric thicknesses, this group offers capacitance densities above 20 $fF/\mu m^2$ at the cost of higher leakage currents (above $1\times10^{-3}$ $A/cm^2$) compared to capacitors made with SN-PSD. Although capacitance density is high, the implementation of these devices as capacitive element in devices and circuits may in various instances be associated with a high leakage current that generates large power consumption and/or limitations to device reliability. In various instances, a solution to decrease the leakage current is by increasing the dielectric thickness that also results in a decrease in capacitance density as shown for devices with 20 nm thickness in FIG. 3.

The second group of devices 302 consists of MIM structures made with $Al_2O_3/TiO_2$ SN-PSDs. When capping layer is at least 5 nm $Al_2O_3$, these capacitors present leakage current densities below $1\times10^{-5}$ $A/cm^2$ and capacitance densities of 13.2 $fF/\mu m^2$ and 17.2 $fF/\mu m^2$ for devices with 150 nm and 50 nm of SN-PSD $Al_2O_3/TiO_2$ ratio of 0.3 nm/0.7 nm (150ATO375 and 50ATO375), respectively. As can be seen from FIG. 3, capacitance density could be further increased up to 22.7 $fF/\mu m^2$ by decreasing the thickness of the $Al_2O_3$ capping layer to 4 nm (150ATO374), however this approach also increases leakage current in more than two orders of magnitude compared to the use of 5 nm $Al_2O_3$ capping layer.

The third group 303 consists of devices made with 100 nm SN-PSD with $HfO_2/TiO_2$ ratio of 0.7 nm/0.3 nm with 5 nm $HfO_2$ top capping layer (100HTO735) and 50 nm SN-PSD with $HfO_2/TiO_2$ ratio of 0.7 nm/0.3 nm without capping layer (50HTO73). FIG. 3 clearly shows that devices without capping layer at all yield higher leakage current performances, whereas 100HTO735 offers capacitance and current leakage densities following the same trend as devices with $Al_2O_3/TiO_2$ SN-PSDs indicating that both electrical characteristics are dictated not only by the thickness of the SN-PSD but also the thickness of the top capping layer.

A full reliability study was performed to the SN-PSD and single layer devices presenting similar capacitance density and current leakage current (enclosed in the circle 304 in FIG. 3). The initial dielectric characteristics of the four samples for reliability test are summarized in Table 1.

| | | | | | VG = 1 V | |
|---|---|---|---|---|---|---|
| Sample Name | Description | Thickness (nm) | Effective K | Equivalent Silicon Oxide Thickness (nm) | Capacitance Density ($fF/um^2$) | Current Density ($A/cm^2$) |
| 150ATO375 | $Al_2O_3$ 0.3 nm, $TiO_2$ 0.7 nm, 150 cycles, Capping layer: $Al_2O_3$ 5 nm | 155 | 257.00 | 2.29 | 15.54 | 6.38E−08 |
| 100HTO735 | $HfO_2$ 0.7 nm, $TiO_2$ 0.3 nm, 100 cycles, Capping layer: $HfO_2$ 5 nm | 105 | 241.94 | 2.43 | 14.63 | 1.08E−06 |
| HfO2-9 nm | 9 nm $HfO_2$ single layer capacitor, performed reliability test | 9 | 14.83 | 2.30 | 14.60 | 1.85E−07 |
| Al2O3-6 nm | 6 nm $Al_2O_3$ single layer capacitor, performed reliability test | 6 | 7.67 | 2.97 | 11.38 | 1.64E−07 |

Figure 4:
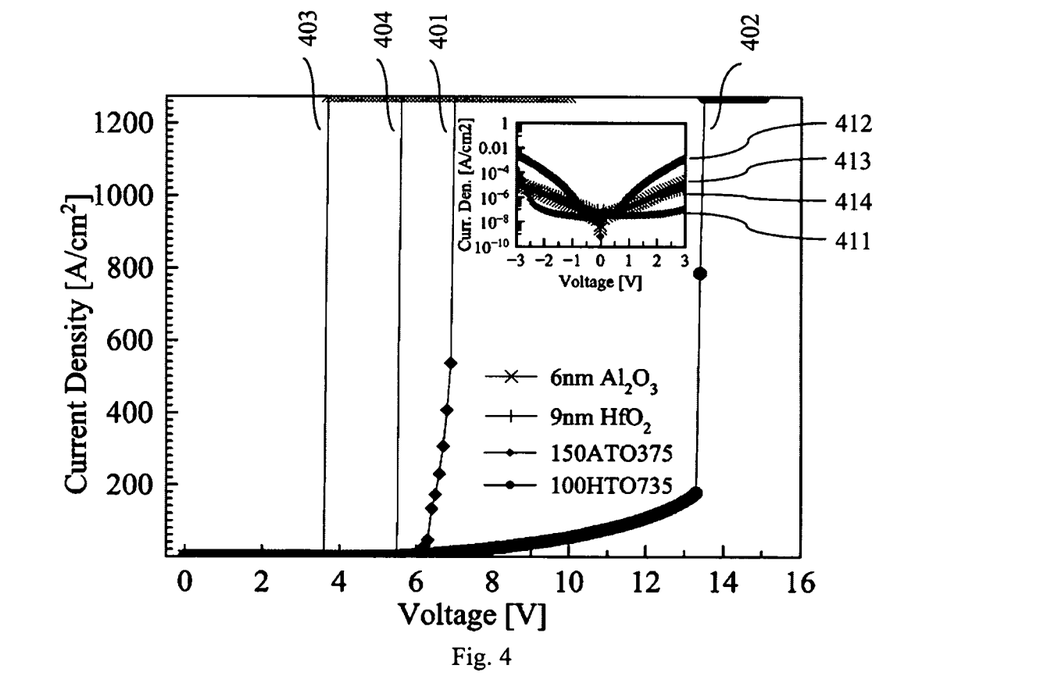
FIG. 4 depicts the current-voltage (I-V) characteristic of single layer and SN-PSD capacitors up to breakdown voltage. The inset is a full sweep from −3V to +3V, in accordance with various embodiments.

FIG. 4 illustrates the I-V characteristics of four devices with similar capacitance densities including 150ATO375 and 100HTO735 SN-PSD devices and single layer capacitors. As voltage keeps increasing, the devices containing single layer $Al_2O_3$ 401 and $HfO_2$ 402 start the breakdown process at 3 V and 4.5 V, respectively, while the ones with the $Al_2O_3/TiO_2$ SN-PSD 403 (150ATO375) and $HfO_2/TiO_2$ SN-PSD 404 (100HTO735) break down until about 6.1 and 6.9V, respectively. The breakdown is defined when the leakage current increases ten times the value of the previous test step or the leakage current increasing to 1 mA for the device with the diameter of 100 um (12.74 $A/cm^2$). The reason for this criterion may be given by the fact that original performance on each device was almost 100% recoverable after releasing the voltage stress if the leakage current was kept below 1 mA for less than 100 s.

The SN-PSD capacitors 403 and 404 exhibited higher breakdown voltage than the traditional single layered $HfO_2$ 402 and $Al_2O_3$ 401 capacitors. This may in various instances be associated with a very large dielectric constant such as may be caused by Maxell-Wagner relaxation. In various instances, the sub-nanometer periodic stack structure can be physically thick and still deliver high capacitance densities. The actual electric field may be reduced significantly under the same bias voltage. The breakdown voltage of SN-PSD is improved.

Considering only the SN-PSD capacitors, the breakdown voltage of the device with $HfO_2/TiO_2$ 404 was higher than the one with $Al_2O_3/TiO_2$ 404. This may be associated in various embodiments with the thicker insulator in each periodic sublayer of $HfO_2/TiO_2$ based SN-PSD ($HfO_2$—0.7 nm) than that of $Al_2O_3/TiO_2$ based SN-PSD ($Al_2O_3$—0.3 nm) with the similar capacitance density, as well as the relatively low leakage current and optimized stability of $HfO_2$ and even the interface states of $HfO_2/TiO_2$.

Inset in FIG. 4 illustrates the full sweep from −3 V to +3 V for the four devices where it can be noticed some level of asymmetry in the current values which could be the result of the capping layer. The 5 nm cap layer was deposited on the top of SN-PSD. $TiO_2$ is a typical electron transport semiconductor, while $HfO_2$ and $Al_2O_3$ are typical insulators. It is worth pointing out that the bottom electrode of the devices was biased at 0 V. The lower leakage current at positive bias may in various instances be a result of a potential barrier formed by the top capping layer able to block the electrons flowing from the SN-PSD layers. It also can be seen from the inset in FIG. 4 that the leakage current at low voltages increases more rapidly for sample 100HTO735 412 compared to 150ATO375 411 and single layer capacitors 413, 414 in about two orders of magnitude. This may in various instances be at least partially due to the different dielectric properties of $HfO_2$ and $Al_2O_3$. $HfO_2$ has a relatively narrow band gap of 5.5 or 6 eV, while $Al_2O_3$ has a relatively wide band gap of 8.8 or 8.9 eV. Therefore, there may be a relatively small band barrier at the interface between $HfO_2$/$TiO_2$ than that of $Al_2O_3$/$TiO_2$ to block the flow of electrons, which results in the relatively higher leakage currents for $HfO_2$/$TiO_2$ SN-PSD MIM device.

Time dependent dielectric breakdown (TDDB) characterization of the capacitors enclosed in the circle 304 in FIG. 3 may be performed under different stress voltages. Our results may show that the hard breakdown of the $Al_2O_3$/$TiO_2$ SN-PSD capacitors occurred at much higher stress voltage compared to the hard breakdown for 6 nm $Al_2O_3$ capacitors that occurred immediately after applying stress voltages of 2.5V, 2.75V, 3V and 3.25V. The hard breakdown of 9 nm $HfO_2$ capacitor occurred at the applied stress voltages of 4.25V and 4.5V. This means the SN-PSD capacitor has much stronger tolerance to the stress voltage than the single layer $Al_2O_3$ or $HfO_2$ capacitor with the similar capacitance density. Single layered devices ($HfO_2$ and $Al_2O_3$) in various instances present a monotonic decrease of leakage current with the stress time that has been attributed to a charge trapping mechanism. As charge is trapped inside the capacitor dielectric, it creates an additional electric field which opposes more charge to enter the insulator and, thus, the current decreases progressively.

Figure 5A:
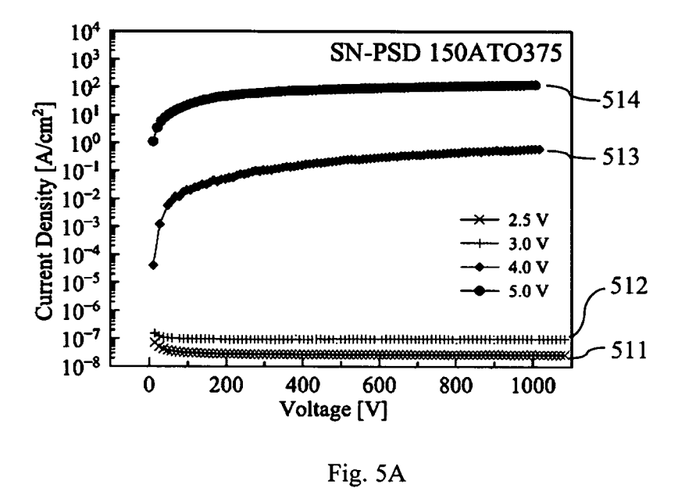
FIG. 5A depicts leakage current density of an $Al_2O_3/TiO_2$ SN-PSD capacitor vs. stress time under different voltages, in accordance with various embodiments.

FIG. 5A shows the current vs. time curves of the $Al_2O_3$/$TiO_2$ SN-PSD capacitors under different stress conditions. Similar accelerated degradation to the single layer of $Al_2O_3$ or $HfO_2$ high k capacitors when the stress voltage is as low as 2.5V can be seen, i.e. the leakage current decreases monotonically with the stress time 511. When the stress voltage was biased at 3V 512, the leakage current of the $Al_2O_3$/$TiO_2$ SN-PSD capacitor was observed to first decrease and then slightly increase with the stress time (FIG. 5A). However, the leakage current of the $Al_2O_3$/$TiO_2$ SN-PSD capacitor increased gradually with the stress time when the stress voltage was higher than 4V 513, 514, quite different from the single layer $Al_2O_3$ or $HfO_2$ capacitors.

Figure 5B:
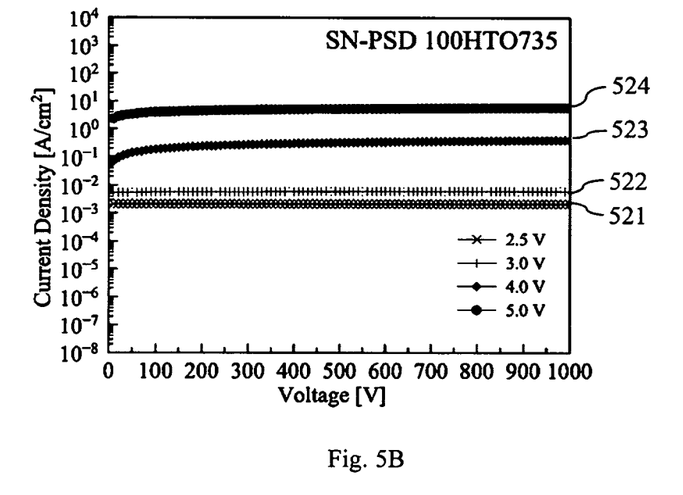
FIG. 5B depicts leakage current density of an $HfO_2/TiO_2$ SN-PSD capacitor with stress time under different voltages, in accordance with various embodiments.

$HfO_2$/$TiO_2$ SN-PSD capacitors experienced similar accelerated degradation trend compared to $Al_2O_3$/$TiO_2$ SN-PSD capacitors, as shown in FIG. 5B. The leakage current under 2.5V stress 521 almost did not change within 1000 S stress time. The leakage current increased gradually with the stress time when the stress voltage was higher than 4V 523, 524.

For the SN-PSD capacitor, the mismatch of the lattice structure of $Al_2O_3$ or $HfO_2$ and $TiO_2$ may create large amounts of interface electron states additional to the electron trap states inside the sub-nanometer thin films. All those electron states may trap electrons which were injected from the low potential biased electrode. We believe those electron trap states led to the difference of the change trends of the leakage current inside the SN-PSD capacitor with the stress time from the single layer insulator capacitor. When the stress voltage is as low as 2.5V in FIG. 5A 511 or 2V in FIG. 5B 521, the electrons initially filled the traps at low energy levels. Like the single layer component oxide capacitor, it may create an additional electric potential to oppose more carriers to enter the SN-PSD capacitor. Thus, the current decreased with the stress time.

At the beginning time of the voltage stress, more electrons are quickly trapped than de-trapped and, thus, the leakage current decreases quickly. As the stress voltage increases, more electrons fill more trap states even at higher energy level while more electrons likely de-trap into the conduction band of the SN-PSD dielectric. With further increase of the stress time, more electrons will likely be de-trapped and the leakage current will increase slowly.

In our TDDB tests the Keithley 4200 SCS was set up in quiet mode, this means, it takes about ten seconds to sample the first current value. We think the large stress voltage (i.e. large applied electric field) rapidly fills the electron trap states and the Keithley 4200 SCS is not able to read the decrease of current at the very beginning of the voltage stress. Meanwhile, the large stress voltage may increase the probability of the electron detrapping from the filled electron trap states. Therefore, it was observed that the leakage current increased monotonically with the stress time in the cases of large voltage stress (like 5V in FIG. 5A 514, and 5V in FIG. 5B 524).

I-V and C-V curves were collected before and after the SN-PSD capacitors were stressed at different voltages for ~1000 s. The C-V and I-V curves of $Al_2O_3$/$TiO_2$ SN-PSD capacitors after stressed for ~1000 s is almost the same as the initial ones (before the voltage stress) when the stress voltage is lower than or equal to 4 V. This implies that the TDDB degradation under stress voltages lower than 4V is caused by occupation status of the electron trap states. As the stress bias is removed, the electron trap states reinstate to the initial status and, thus, the dielectric properties of the SN-PSD capacitor are 100% recovered.

FIG. 5A also illustrates that the current of $Al_2O_3$/$TiO_2$ SN-PSD capacitors increased up to five orders of magnitude when the stress voltage was higher than 5 V 514. The voltage stress may change the occupation status of the electron states inside the sub-films and at the interfaces between two adjacent sub-films. Higher stress voltage may result in more filled electron trap states and then more electrons jump out from the trap states to enter the conduction band. However, I-V and C-V characteristics were in various embodiments not reinstated to the original behavior after the stress voltage was resealed. Therefore, there may be further mechanisms causing the degradation of the dielectric performance of the SN-PSD capacitors. For instance, in various instances the large voltage stress may induce the change of the electron trap states, migration of oxygen or the other ions, the degradation of the dielectric performance at the sub layer level, the degradation of Maxwell-Wagner type dielectric relaxation or some diffusion of the metal electrode into the dielectric layers.

After stressed at 6.5V (higher than the breakdown voltage of 6.1V) for 1000 S, no C-V characteristics were measured. The dielectric properties of the device were unrecoverable (hard breakdown). The breakdown was not observed to be recovered in any degree by removing the stress voltage. It is important to note that devices were re-measured 5 months after the breakdown without successfully recovering the original behavior.

The recorded current of the hard broken-down $Al_2O_3$/$TiO_2$ SN-PSD capacitors was linear within the range of [−105 mA, 105 mA], which is the highest compliance of a Keithley 4200 SCS system used. But the leakage current of the broken down SN-PSD capacitor was lower than the broken down single layer $HfO_2$ or $Al_2O_3$ capacitor. I-V curves illustrate there is a conductive path created with the breakdown in the dielectric layer, which may be caused by some electrode metal diffusing into or $TiO_2$ into the $Al_2O_3$ sublayers. The low leakage current in the broken down SN-PSD capacitor shows that there may be no metal path formed between top and bottom electrode. This may be attributed to the thick SN-PSD dielectric layers and low conductivity of $TiO_2$.

The C-V and I-V curves of $HfO_2$/$TiO_2$ SN-PSD capacitors before and after stress for all bias voltages for ~1000 s are almost the same. No unrecoverable damage was observed after the stress was released. So one may appreciate that the TDDB degradation of $HfO_2$/$TiO_2$ SN-PSD under the stress conditions may be caused by electron trapping and de-trapping.

The I-V and C-V measurement at initial time and after the breakdown test show that soft breakdowns occurred in the $Al_2O_3$/$TiO_2$ SN-PSD capacitors when was performed the voltage driving breakdown test or the TDDB test under the voltage stress lower than 4V. The performance of $Al_2O_3$/$TiO_2$ SN-PSD capacitor was observed to be recovered immediately after the sweeping voltage or the voltage stress was removed. The soft breakdown was observed in HfO2/TiO2 SN-PSD capacitors under all the voltage stress for 1000 s. The soft breakdown was also observed occurring in single layer $HfO_2$ capacitors under voltage of 4V as well, but not observed occurring in single layer $Al_2O_3$ capacitor.

I-V measurement at initial time and after breakdown under voltage stress of 5V also illustrates the leakage current in the broken-down $Al_2O_3$/$TiO_2$ SN-PSD decreased by 2 orders of magnitude after it was put in the air at room temperature for ~5 months. The performance degradation of the broken-down $Al_2O_3$/$TiO_2$ SN-PSD capacitor with a cap layer was partly recovered. It means the mechanisms of stress induced degradation may include recoverable and un-recoverable damages.

The performance of $HfO_2$/$TiO_2$ SN-PSD capacitor was immediately recovered after each voltage stress for 1000 s when the compliance of Keithley 4200 was set at 1 mA. But the performance degradation was observed when the compliance of Keithley 4200 was set at 100 mA. It demonstrates the $HfO_2$/$TiO_2$ SN-PSD capacitor is in various embodiments more reliable than the $Al_2O_3$/$TiO_2$ SN-PSD and single layer capacitors.

Figure 6:
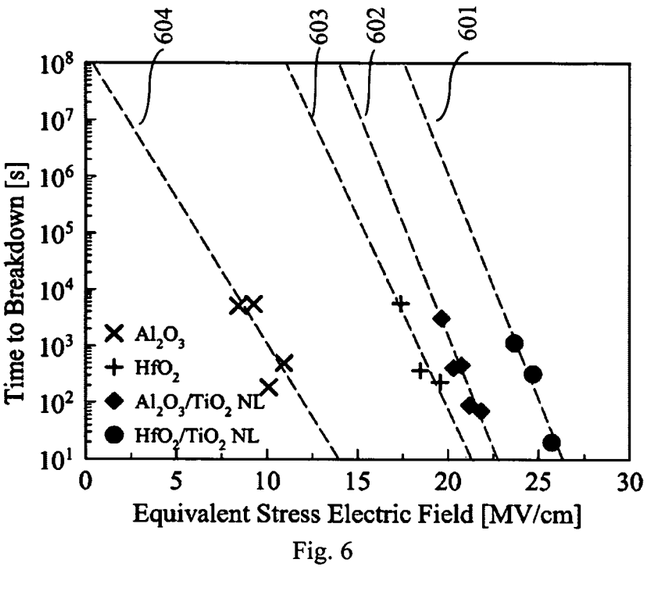
FIG. 6 depicts dielectric breakdown lifetime of various SN-PSD capacitors, in accordance with various embodiments.

The TDDB lifetime extrapolation in FIG. 6 illustrates that dielectric breakdown lifetime in various embodiments would exceed 10 years under the stress voltage of 4.0V for $HfO_2$/$TiO_2$ SN-PSD capacitors, 2.3V for $Al_2O_3$/$TiO_2$ SN-PSD capacitors, and 2.1V for ALD $HfO_2$ capacitor. The equivalent electric field normalized by their equivalent silicon oxide thickness is 16.5 Mv/cm for $HfO_2$/$TiO_2$ SN-PSD capacitors 601, 10.0 Mv/cm for $Al_2O_3$/$TiO_2$ SN-PSD capacitors 602, and 9.1 Mv/cm for ALD $HfO_2$ capacitor 603. But the dielectric breakdown lifetime of ALD $Al_2O_3$ capacitor may be extrapolated never longer than 10 years 601, no matter how low the stress voltage is. In other words, the dielectric breakdown lifetime of SN-PSD MIM Capacitor may be longer than the $HfO_2$ capacitor or $Al_2O_3$ capacitor under the same stress voltage. Also, $HfO_2$/$TiO_2$ SN-PSD capacitor exhibited much longer lifetime than the $AL_2O_3$/$TiO_2$ SN-PSD capacitor.

To further enhance capacitance density and leakage performance, other embodiments are contemplated.

High-k dielectric capacitors utilizing SN-PSD are not limited to two sublayers. In another embodiment, three layers of different materials with HfOx/ZrOx/$TiO_2$ SN-PSD dielectric material, consisting of 150-1500 nm alternating layers with top cap layer of HfOx on both sides.

In another embodiment, three layers of different materials with AlxOy/HfOx/$TiO_2$ SN-PSD dielectric material are used, consisting of 150-1500 nm alternating layers with top cap layer of AlxOy on both sides.

The high dielectric constant materials used in sublayers further include $Al_xO_y$, HfOx, $TiO_x$, ZrOx $ZnO_x$, $SiO_2$, SiNx, and BaSrxTiy. Since the dielectric constant of SN-PSD may be much large than that of the component oxides and can be readily deposited at 250° C. using atomic layer deposition (ALD), the ALD deposition cycle may be 20-1000 cycles. The deposition technology is not limited to ALD, but include thermal oxidation, chemical vapor deposition (CVD), plasma enhanced chemical vapor deposition (PECVD) and other thermal source assisted deposition techniques.

Optimization of an SN-PSD MIM capacitor may include a capping layer, preferably of self-assembled monolayers (SAMs). Self-assembled monolayers (SAMs) of organic molecules represent a versatile technique to modify the properties of metal and metal oxide surfaces. In particular, alkane-terminated phosphonic acids binds strongly to a variety of metal and metal oxides and the resulting SAMs exhibit excellent performance as gate dielectric in organic thin film transistors, A octadecylphosphonic acid (ODPA) SAM formed on top of a thin $AlO_x$ film decreased J by three orders of magnitude. In various instances the effect of alkylphophonic acid SAM capping layers on the performance of SN-PSD MIM capacitors containing $TiO_2$ and $HfO_2$ sublayers are disclosed. In particular, we show that varying the alkyl chain length significantly affects J and breakdown voltage ($V_{bd}$) of these capacitors. Finally, we demonstrate that through the effective suppression of J, a SN-PSD MIM capacitor using ODPA SAM capping layer exhibits a 60% improvement in $C_{den}$ compared to control devices using a $HfO_2$ capping layer.

ODPA, tetradecylphosphonic acid (TDPA), decylphosphonic acid (DPA), butylphosphonic acid (BPA), and anhydrous isopropanol were purchased from Sigma-Aldrich and were used as received. SN-PSD capacitors were fabricated between Pt electrodes. First, 10 nm Ti/100 nm Pt were e-beam evaporated on Si wafer. $HfO_2$ and $TiO_2$ were deposited using atomic layer deposition by reaction of $HfCl_4$ and $TiCl_4$ with $H_2O$ at 250 C, under reaction conditions of, and the film thickness was monitored using quartz crystal microbalance. For the SN-PSD, 100 cycles of 0.5 nm $HfO_2$/0.5 nm $TiO_2$ were deposited, and a final layer of 0.5 nm $HfO_2$ was deposited, yielding a total SN-PSD thickness of ~100 nm. The SN-PSD-coated wafer was then cut into~1.5 cm×2.5 cm pieces. SAM capping layers were then deposited on SN-PSDs. 7 mL solution of 5 mM ODPA, TDPA, DPA, or BPA in anhydrous isopropanol was prepared in a 50 mL disposable polypropylene centrifuge tube (Corning) in $N_2$ atmosphere. A piece of SN-PSD sample was placed inside, and the centrifuge tube was capped and tilted so that the SN-PSD was face down and submerged in solution at room temperature for 16 hours. The sample was then removed from solution, rinsed with copious amount of anhydrous isopropanol, dried with $N_2$ gun, and placed on a hot plate at 60 C for 10 min in $N_2$ atmosphere. The capacitors were then defined by e-beam evaporation of Pt through a shadow mask with 100 µm diameter circular openings. Two additional control samples were fabricated, one containing no capping layer, and another containing 5 nm $HfO_2$ on SN-PSD as capping layer. AC capacitance and current measurements between 100 Hz and 1 MHz as a function of DC voltage between −3.5 V and 3.5 V and other conditions were performed in air using a LCR meter, with the top electrode as the working electrode. At least 3 capacitors were measured per sample for statistics. For FTIR characterization of SAMs, 5 nm $HfO_2$ was deposited on Si/Ti/Pt by ALD, and the SAMs were deposited using the procedure described above. FTIR absorbance spectra of SAMs were collected from 400-4000 $cm^{-1}$ in a $N_2$-purged Therno Nicolet is 50 spectrometer. The spectrometer is equipped with a home-built grazing incidence reflection accessory employing gold coated mirrors to direct the beam at 80 degrees with respect to the substrate normal. A polarizer was used to select only the p-polarized component of the beam. The spectral resolution was 4 $cm^{-1}$, and 3 independent measurements of 512 scans were averaged for each spectrum. The spectra were referenced to measurements of a clean substrate with no SAM attached.

Figure 7A:
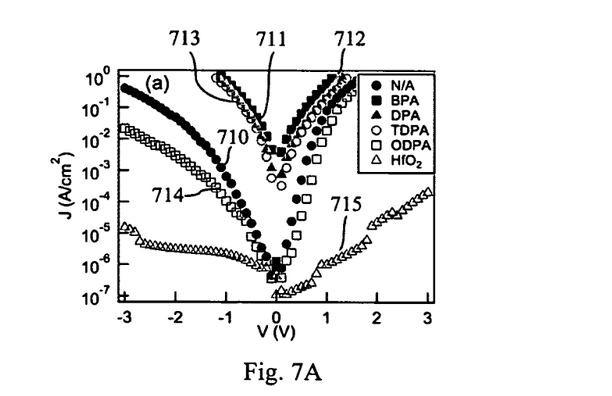
FIG. 7A depicts leakage current density J at 100 kHz as a function of voltage for SN-PSD capacitors with a capping layer of nothing, BPA SAM, DPA SAM, TDPA SAM, ODPA SAM and 5 nm $HfO_2$, in accordance with various embodiments.
Figure 7B:
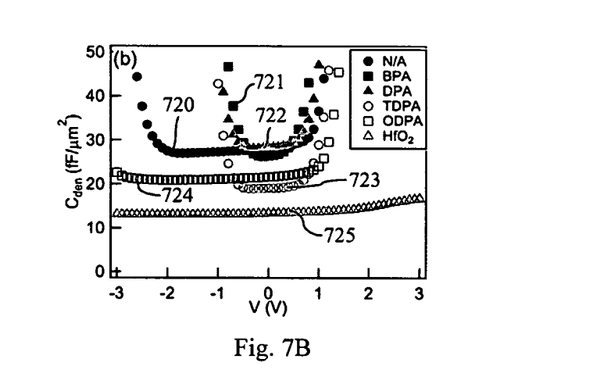
FIG. 7B depicts capacitance density at 100 kHz as a function of voltage for SN-PSD capacitors with a capping layer of nothing, BPA SAM, DPA SAM, TDPA SAM, ODPA SAM and 5 nm $HfO_2$, in accordance with various embodiments.

The introduction of SAM capping layers provides tunable suppression of J and improvement in $C_{den}$ for the SN-PSD MIM capacitors, consistent with the length of the alkyl terminal group. J-V curve of the SN-PSD capacitor without capping layer (FIG. 7A, 710) shows an asymmetric response, with J at forward bias (positive bias for top electrode) exhibiting higher values than J at reverse bias (negative bias for top electrode). This may in various instances be caused by the fact that the interface between SN-PSD and top Pt is buried and therefore is not exposed to air, leading to a work function farther away from the midgap of $HfO_2$ and hence greater current injection. Treatment with BPA SAM also causes J to increase at all V values (FIG. 7A, 711), indicating that the short molecule exhibits a reduced effectiveness at suppression of leakage current. Increasing alkyl chain length with DPA (FIG. 7A, 712) and TDPA (FIG. 7A, 7B) results in J that decreases with increasing chain length, but the value is still higher than the control without capping layer. In contrast, the sample with ODPA SAM (FIG. 7A, 714) exhibited lower J than the control, suggesting that the SAM is finally contributing to the suppression of leakage current. Finally, we will note that 5 nm $HfO_2$ capping layer yields the lowest J values (FIG. 7A, 715). The capping layers also significantly influenced $C_{den}$ in two aspects. First, the expected voltage-independent $C_{den}$ over different voltage ranges depending on the capping layer (FIG. 7B). Indeed, $C_{den}$ values become unphysical when $J>10^{-2}$ $A/cm^2$. Thus, if we define breakdown voltage $V_{bd}$ as the voltage at which this transition occur for both forward and reverse bias (Table 2), we see that $V_{bd}$ values increases with increasing alkyl chain length in the SAM, but does not exceed the control without capping layer until ODPA (FIG. 7B 724) was used, and is not as wide as the control with 5 nm $HfO_2$. At the same time, the capping layer negatively impacts $C_{den}$, as expected from geometric considerations. The inclusion of an ODPA SAM capping layer 724 decreased $C_{den}$ at 0V from 27.8±2.6 $fF/µm^2$ to 22.0±2.5 $fF/µm^2$, which is still 60% higher than a capping layer of 5 nm $HfO_2$ 725 at 13.7±0.7 $fF/µm^2$ (Table 2).

TABLE 2

$C_{den}$ at 0 V and $V_{bd}$ at forward and reverse bias for SN-PSD capacitors with different capping layers.

| Capping Layer | $C_{den}$ 0 V [$fF/µm^2$] | $V_{bd}$ forward [V] | $V_{bd}$ reverse [V] |
|---|---|---|---|
| Nothing | 27.8 ± 2.6 | 0.9 ± 0.2 | −1.5 ± 0.1 |
| BPA | 25.8 ± 0.8 | 0.2 ± 0.1 | −0.2 ± 0.1 |
| DPA | 28.0 ± 1.0 | 0.4 ± 0.1 | −0.3 ± 0.1 |
| TDPA | 18.9 ± 1.1 | 0.4 ± 0.0 | −0.3 ± 0.0 |
| ODPA | 22.0 ± 2.5 | 0.9 ± 0.1 | −3.0 ± 0.5 |
| 5 nm $HfO_2$ | 13.7 ± 0.7 | >3.0 | >3.0 |

Given the organic nature of the SAMs, environmental and thermal stability of the SN-PSD capacitors represent a reasonable concern. To evaluate these properties, one may expose the devices to RT air at 30% relative humidity for 20 days, and then measure their capacitance-voltage and current-voltage response. In various embodiments, the aged devices displayed unchanged J and $C_{den}$ curves compared to as-made samples. The devices, upon heating, may at successively higher temperatures in air for 30 min, and exhibit a characterized response wherein after 100 C heating, the J and $C_{den}$ curves remain unchanged, and the trend continues up to 200 C.

Capping layers consisting of self-assembled monolayers of alkylphosphonic acids may further significantly improve the performance of nanolaminate metal-insulator-metal capacitors. The alkylphosphonic acid forms bidentate binding to $HfO_2$, and the areal density of the SAM on $HfO_2$ appears independent of the alkyl chain length. Octadecylphosphonic acid SAM capping layer resulted in good suppression of leakage current and thus a 60% increase in capacitance density compared to a 5 nm $HfO_2$ capping layer. The SAM also exhibits good environmental and thermal stability up to 200 C. Thus, SAM represents a versatile and effective approach to optimize the response of high-performance dielectric capacitors.

One may appreciate that in view of the disclosure herein, various aspects may be provided in numbered sections below. The following paragraphs summarize various such aspects consistent with the disclosure herein above.

Numbered Item 1: For example, in various embodiments, there is a sub-nanometric periodic stacked dielectrics (SN-PSD) containing alternating high dielectric constant materials sublayer and low leakage dielectric sublayer. Top and bottom layers are low leakage current dialectic materials. Every sublayer has thickness less than 1 nm. The high dielectric constant materials could be one or more different materials. The low leakage dielectric materials could be one or more different materials. Since the dielectric constant of SN-PSD is much large than that of the component oxides and can be readily deposited at 250° C. using atomic layer deposition (ALD), the ALD deposition cycle could be 20-1000 cycles. The deposition technology is not limited to ALD, could be thermal oxidation, chemical vapor deposition (CVD), plasma enhanced chemical vapor deposition (PECVD) and other thermal source assisted deposition.

Numbered Item 2: Compared with single layer dielectric, SN-PSD has changed the breakdown mechanism from hard breakdown to soft breakdown. The breakdown dielectric could be recovered after few days.

Numbered Item 3: The aspects of Numbered Item 2 above, further including wherein the sublayer could be $Al_xO_y$, $HfO_x$, $TiO_x$, $ZrO_x$, $ZnO_x$, $SiO_2$, $SiN_x$, BaSrxTiy or other dielectric materials.

Numbered Item 3: An $Al_2O_3/TiO_2$ SN-PSD dielectric material may be provided, consisting of 150-1500 nm alternating layers of 0.3 nm $Al_2O_3$ and 0.7 nm $TiO_2$ with at least 5 nm $Al_2O_3$ top cap layer only, exhibited the capacitance density of 15.54 $fF/um^2$ and the leakage current of 6.38E-8 $A/cm^2$ at the bias voltage of 1V. The non-uniformity of capacitors is about 5%. (Flow rate: 20 sccm of N2 purging the chamber during deposition, using 0.015 sec. pulse of Al2O3, 0.1 sec. of pulse Ti and 0.4 sec. pulse of Al.) (Pressure: Base pressure was 0.4 Torr and increase up to 0.55 Torr in during each pulse.) (Deposition time: For 100 nm of SN-PSD with 5 nm of cap layer may be 5 hrs. and 40 min. approximately)

Numbered Item 4: The aspects of Numbered Item 2 above, further including wherein there may be capping layers on both sides of dielectric.

Numbered Item 5: Also provided is a $HfO_2/TiO_2$ SN-PSD MIM dialectic material consisting of thickness of 150 nm-1500 nm, alternating layers of 0.5 nm $HfO_2$ and 0.5 nm $TiO_2$ with at least 5 nm $HfO_2$ top cap layer only, exhibited the capacitance density of 30.26 $fF/um^2$ and the leakage current of 2.1E-05 $A/cm^2$ at the bias voltage of 1 V. The non-uniformity of capacitors may be about 5%. (Flow rate: 20 sccm of N2 purging the chamber during deposition, using 0.015 sec. pulse of H2O, 0.1 sec. of pulse Ti and 0.4 sec. pulse of Hf) (Pressure: Base pressure was 0.4 Torr and increase up to 0.55 Torr in during each pulse.) (Deposition time: For 100 nm of SN-PSD with 5 nm of cap layer may be 5 hrs. and 40 min. approximately)

The TDDB lifetime extrapolation indicates that the dielectric breakdown lifetime may exceed 10 years under the stress voltage of 4.0V (equivalent electric field of 16.5 Mv/cm) for $HfO_2/TiO_2$ SN-PSD capacitors, 2.3V (equivalent electric field of 10.0 Mv/cm) for $Al_2O_3/TiO_2$ SN-PSD capacitors, 2.1V (equivalent electric field of 9.1 Mv/cm) for ALD $HfO_2$ capacitor. So, the dielectric breakdown lifetime of SN-PSD MIM Capacitor is obviously longer than the $HfO_2$ capacitor or $AL_2O_3$ capacitor under the same stress voltage. Soft break down was observed on SN-PSD MIM devices. Compared to $AL_2O_3/TiO_2$ SN-PSD capacitor, the newly developed $HfO_2/TiO_2$ SN-PSD capacitor not only behaved twice capacitance density, also showed much longer life time.

Numbered Item 6: The aspects of Numbered Item 5 above, further including wherein there may be capping layers on both sides of dielectric.

Numbered Item 7: There may be provided, three layers of different materials with $HfOx/ZrOx/TiO_2$ SN-PSD dielectric material, consisting of 150-1500 nm alternating layers with top cap layer of HfOx on both sides. This structure is expected to further improve the capacitance density and leakage performance.

Numbered Item 8: There may be provided, three layers of different materials with $AlxOy/HfOx/TiO_2$ SN-PSD dielectric material, consisting of 150-1500 nm alternating layers with top cap layer of AlxOy on both sides. This structure is expected to further improve the capacitance density and leakage performance.

Numbered Item 9: Disclosed herein is the use of self-assembled monolayers (SAM) as capping layers can significantly improve the performance of $HfO_2/TiO_2$ SN-PSD metal-insulator-metal capacitors. In particular, by examining the effect of controlling the chain length of alkylphosphonic acid molecules, we find that an octadecylphosphonic acid self-assembled monolayer offer a good compromise between suppression of leakage current and minimization of capping layer thickness, resulting in a 60% improvement in capacitance density compared to $HfO_2$ capping layer.

Numbered Item 10: The aspects of Numbered Items 1-9 above, further comprising high dielectric materials with SAM layers.

What is claimed:

1. A high dielectric constant thin film manufactured using low temperature sub nanometer periodic stack dielectrics (SN-PSD) comprising:
a plurality of sublayers, wherein the plurality of sublayers consecutively alternate between a low leakage dielectric sublayer and a high dielectric constant sublayer, wherein both the low leakage dielectric sublayer and the high dielectric sub layer have a thickness of less than 1 nanometer;
wherein the plurality of sublayers are stacked in order according to a value of a leakage current of each of different materials of the plurality of sublayers, from a lowest value to a highest value to a second-lowest value.

2. The high dielectric constant thin film of claim 1, further comprising a first capping layer positioned on a top of the plurality of sublayers and a second capping layer positioned on a bottom of the plurality of sublayers, the first capping layer and the second capping layer configured to limit current leakage.

3. The high dielectric constant thin film of claim 2, wherein the first capping layer and the second capping layer comprise any of a plurality of inorganic current blocking materials or organic current blocking materials.

4. The high dielectric constant thin film of claim 3, wherein the plurality of inorganic current blocking materials or organic current blocking materials comprise any of:
a pure form of any of a plurality of materials;
a doped form of any of the plurality of materials;
a self-assembled monolayer made from octadecylphosphonic acids;
a base alloy of the plurality of materials; or
a mixture of one or more of the plurality of materials;
the plurality of materials comprising HfOx, HfxSiOy, ZrOx, ZrxSiOy, LaxGdOy, SiOx, SiNx, SiOxNy, and TaOx.

5. A high dielectric constant thin film manufactured using low temperature sub nanometer periodic stack dielectrics (SN-PSD) comprising:
a plurality of sublayers, wherein the plurality of sublayers consecutively alternate between a low leakage dielectric sublayer and a high dielectric constant sublayer, wherein both the low leakage dielectric sublayer and the high dielectric sub layer have a thickness of less than 1 nanometer;
wherein the plurality of sublayers are stacked in order according to a value of an energy band gap from widest to narrowest to second widest.

6. The high dielectric constant thin film of claim 5, further comprising a first capping layer positioned on a top of the plurality of sublayers and a second capping layer positioned on a bottom of the plurality of sublayers, the first capping layer and the second capping layer configured to limit current leakage.

7. The high dielectric constant thin film of claim 6, wherein the first capping layer and the second capping layer comprise any of a plurality of inorganic current blocking materials or organic current blocking materials.

8. The high dielectric constant thin film of claim 7, wherein the plurality of inorganic current blocking materials or organic current blocking materials comprise any of:
- a pure form of any of a plurality of materials;
- a doped form of any of the plurality of materials;
- a self-assembled monolayer made from octadecylphosphonic acids;
- a base alloy of the plurality of materials; or
- a mixture of one or more of the plurality of materials;
- the plurality of materials comprising $HfO_x$, $Hf_xSiO_y$, $ZrO_x$, $Zr_xSiO_y$, $La_xGdO_y$, $SiO_x$, $SiN_x$, $SiO_xN_y$, and $TaO_x$.

* * * * *